United States Patent [19]

Naka et al.

[11] Patent Number: 4,701,927
[45] Date of Patent: Oct. 20, 1987

[54] LIGHT EMITTING CHIP AND OPTICAL COMMUNICATION APPARATUS USING THE SAME

[75] Inventors: Hiroshi Naka, Komoro; Ichiro Seko, Takasaki; Shuji Kobayashi, Isezaki; Makoto Haneda, Takasaki, all of Japan

[73] Assignee: Hitachi, Ltd., Tokyo, Japan

[21] Appl. No.: 695,005

[22] Filed: Jan. 25, 1985

[30] Foreign Application Priority Data

Jan. 25, 1984 [JP] Japan ................... 59-10008

[51] Int. Cl.$^4$ .................. H01L 33/00; H01S 3/19
[52] U.S. Cl. ....................... 372/46; 357/17; 372/45
[58] Field of Search .............. 372/46, 45, 44, 43; 357/17

[56] References Cited

U.S. PATENT DOCUMENTS 4,426,700 1/1984 Hirao et al. .............. 372/45
4,566,171 1/1986 Nelson et al. ............ 372/46

FOREIGN PATENT DOCUMENTS

| 0007730 | 2/1980 | European Pat. Off. . |
| 0026062 | 4/1981 | European Pat. Off. . |
| 0042484 | 5/1981 | European Pat. Off. . |
| 0044571 | 7/1981 | European Pat. Off. . |
| 0033137 | 8/1981 | European Pat. Off. . |
| 0038085 | 10/1981 | European Pat. Off. . |
| 0069563 | 7/1982 | European Pat. Off. . |
| 3036431 | 4/1981 | Fed. Rep. of Germany . |
| 3046140 | 7/1982 | Fed. Rep. of Germany . |
| 2507357 | 8/1983 | Fed. Rep. of Germany . |
| 1502953 | 2/1975 | United Kingdom . |
| 2031644 | 4/1980 | United Kingdom . |
| 2105100 | 3/1983 | United Kingdom . |

OTHER PUBLICATIONS

Hirao et al, "Fabrication and Characterization of Narrow Stripe InGaAsP/InP Buried Leterstructure Lasers", J. Appl. Phys., 5(18), Aug. 1980, pp. 4539–4540.
Tronmer et al., "LPE of (In,Ga)(AsP) and (InGa)As on InP for 1.3 μm High-Rechance IRED's and for Photodiodes in the 1.3 μm to 1.65 μm Wavelength Range," Siemens Forsch-n, Entwickl-Ber, Bd.11(1982), No. 4, 1982, pp. 204–208.
Hens-George, "Optische Nachrichtentechnik", Bibliothek Des Deutschen Patentamtes, Apr. 9, 1976, pp. 63–73.

Primary Examiner—James W. Davie
Assistant Examiner—Georgia Y. Epps
Attorney, Agent, or Firm—Antonelli, Terry & Wands

[57] ABSTRACT

This invention relates to a semiconductor laser of a buried-hetero structure. In this semiconductor laser, the side surfaces of an active layer are in contact with a plane having a stable state of interface. As a result, the threshold current value of this semiconductor laser is low, and a stable operation can be obtained without causing any kink (projection) in the current-optical output characteristics. An optical communication system using this semiconductor layer has a low operating current, and can maintain high coupling efficiency with an optical fiber without the occurrence of noise, so that optical communication having high reliability is possible.

9 Claims, 13 Drawing Figures

LIGHT EMITTING CHIP AND OPTICAL COMMUNICATION APPARATUS USING THE SAME

BACKGROUND OF THE INVENTION

This invention relates generally to a light emitting chip and to an optical communication apparatus using the light emitting chip.

The semiconductor laser has been used as a light emitting source in audio discs, video discs, optical communications, and similar devices.

A buried-hetero structure (hereinafter abbreviated to "BH") has been developed as one of the structures of the semiconductor laser chip of the type described above. For example, the magazine "Electronics Materials", published by Industrial Research Association, April, 1979, pages 26-28 describes a GaAs-GaAlAs system BH semiconductor laser, and the same magazine also describes in the April issue, 1983, page 92, an InP-InGaAsP system BH semiconductor laser. A visible light band semiconductor laser (wavelength=0.7-0.9 μm) formed by the GaAs-GaAlAs system has substantially the same BH laser chip structure as that of a long wave band semiconductor laser (wavelength=1.2-1.6 μm) formed by the InP-InGaAsP system Now, the long wave band semiconductor laser will be explained by way of example.

Figure 1:
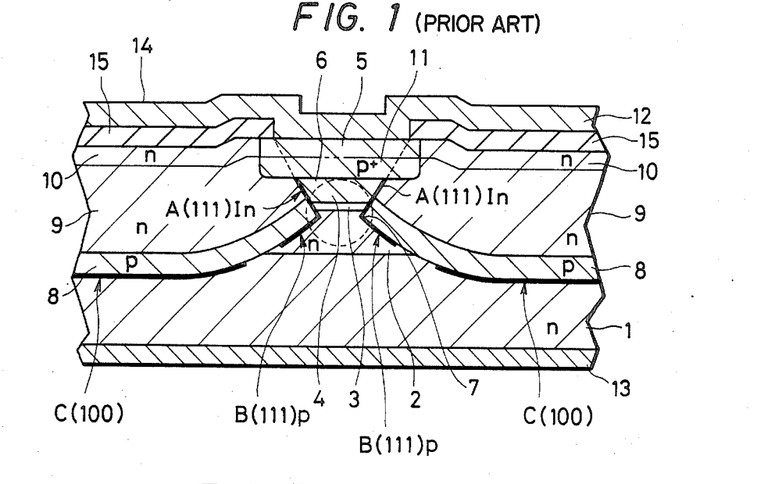
FIG. 1 is a sectional view of the BH laser chip which was developed by the applicant prior to this invention.

FIG. 1 illustrates the structure of the BH type semiconductor laser developed by the inventors of the present application prior to the present invention. A buffer layer 2 consisting of low concentration n-type InP, an active layer 3 (d=0.15 μm) consisting of undoped InGaAsP, a clad layer 4 consisting of p-type InP and a cap layer 5 consisting of p-type InGaAsP are sequentially formed by a liquid phase epitaxial process on an n-type InP single crystal substrate 1 having a (100) crystal plane on its main surface. The total thickness of these four epitaxial layers is from approximately 3 to 4 μm. Thereafter, this multi-layered grown layer is removed by the customary photolithographic process with an etching solution such as bromoethanol so that the cap layer 5 is left in a striated form having a width of from 5 to 6 μm. This striated portion is disposed in such a manner as to extend in the direction of <110> axis of the crystal so that the edge surface of the active layer 3 becomes a (110) cleavage to improve the light emitting efficiency. In consequence, the crystal exhibits anisotropy with respect to the etching solution described above, and the portion extending over the active layer 3, the clad layer 4 and the cap layer 5 has an inverted truncated triangle cross section, that is, an "inverted mesa" structure. The side plane forming this inverted mesa structure (hereinafter referred to as the "inverted mesa plane" for the sake of description) becomes a (111) crystal plane on which the In atom appears.

The lower part of the inverted mesa structure of the strip portion continues a forward mesa structure described by gentle curves B and C as shown in the drawing, and the boundary between the inverted mesa structure and the forward mesa structure becomes a portion having the smallest width (hereinafter called a "neck" for the sake of description). The portion 6 encircled by a dotted line will be called a "double hetero structure" for the sake of description.

In the drawing, symbol B represents the (111) plane on which the P (phosphorus) atom appears, and symbol C represents the (100) plane or the plane in the proximity of the former. The active layer 3 is formed above this neck portion (see "Electronics Materials", published by Industrial Research Association, April, 1983, page 92, FIG. 7).

After this mesa etching, the portion which has been etched and which has become recessed is buried by laminating a blocking layer 8 covering the side surface of the active layer 3 and consisting of p-type InP, a buried layer 9 consisting of n-type InP and a cap layer 10 consisting of n-type InGaAsP. Zn is diffused into the mesa portion 9 so as to reach the intermediate portion of the clad layer 4, and a p+ type ohmic contact layer 11 is defined. Furthermore, electrodes 12 and 13 are disposed at predetermined positions on the mesa portion and on the reverse of the substrate 1, respectively. The substrate 1 is then divided in a predetermined manner into laser chips 14 of several hundred μm square. Reference numeral 15 in the drawing represents an insulating film (SiO$_2$ film).

When used as the light source for optical fiber communication, the semiconductor layer chip must have characteristics such that it has a low operating current, that a large optical output can be sent into the optical fiber, that modulation can be made up to a high frequency, that the spectral wide is small, and that the change of the optical characteristics with the temperature change is small. The BH laser chip has been employed so as to satisfy these requirements.

The applicants have made intensive studies in order to develop a laser chip which is operative at a low operating current (low threshold current I$_{th}$) and has high performance. The process of these studies will be described briefly.

First of all, the inventors believe that since the threshold current (I$_{th}$) of the semiconductor laser depends only upon the width and thickness of the active layer, the position of the active layer at the mesa-like double hetero Junction is a mere parameter that decides the width of the active layer.

Therefore, the inventors have developed a technique which can obtain the width of the active layer in a desired width range (e.g. from 1.1 to 1.9 μm) with a high yield, and can locate the center position of the active layer having a thickness of 0.15 μm within a range extending from a position deviating by 0.5 μm towards the upper side from the neck (hereinafter called the "positive side") to a position deviating by 0.2 μm towards the lower side from the neck (hereinafter called the "negative side").

However, in the BH laser chip described above, a problem is encountered in that, since it is difficult to control the position, (i.e. height) and width, of the active layer 3 and the width of the neck 7, they readily tend to deviate from the predetermined values so that the threshold current (I$_{th}$) increases while the production yield drops.

The applicants assume that the reason for this is as follows. Since the active layer is arranged at the position close to the neck having the smallest width, the width will change drastically if the position of the active layer moves only slightly upward from the neck.

To cope with this problem, the applicants have produced the BH laser chip by arranging the center position of the active layer 3 above the neck 7 so that the change of the width remains unremarkable even if the position of the active layer changes in the vertical direction to some extent.

However, many BH laser chips produced in this manner still exhibit greater threshold current values ($I_{th}$) than the rated value.

The present invention is completed on the basis of the studies described above.

SUMMARY OF THE INVENTION

It is therefore an object of the present invention to provide a light-emitting chip having a low threshold current value.

It is another object of the present invention to provide an optical communication apparatus ensuring stable and highly reliable optical communication by incorporating therein a light-emitting chip having a low driving current and high stability.

The objects of the invention described above can be accomplished by the following construction.

In the light-emitting chip in accordance with the present invention, the side surface of an active layer which emits the laser light from its end surface is disposed on the (111) plane (B plane) having an interface state which is stable and on which phosphorus (P) atoms appear, and the width of the active layer is prescribed to 1.6–2.0 μm. Therefore, an unnecessary leakage path does not occur because the side surface of the active layer is in contact with the (111) plane having a stable interface state. Therefore, both leakage current and threshold current value can be reduced.

Since the threshold current is small, the driving current also becomes small, the exothermy of the chip becomes less and laser light emission can be effected in a stable manner. Since the occurrence of the kink in the current-optical output characteristics can be prevented, the laser chip of the invention, when assembled in an optical communication apparatus, can prevent the occurrence of noise and can stabilize optical coupling with an optical fiber, thereby accomplishing optical communication having high reliability.

DESCRIPTION OF THE PREFERRED EMBODIMENT

Hereinafter, the present invention will be described with reference to a preferred embodiment thereof.

[Embodiment]

First of all, defect analysis carried out by the inventors of the present invention will be described. The inventors have made defect analysis of the problem described earlier in "Background of the Invention" of this specification, and have found the following fact.

Figure 2:
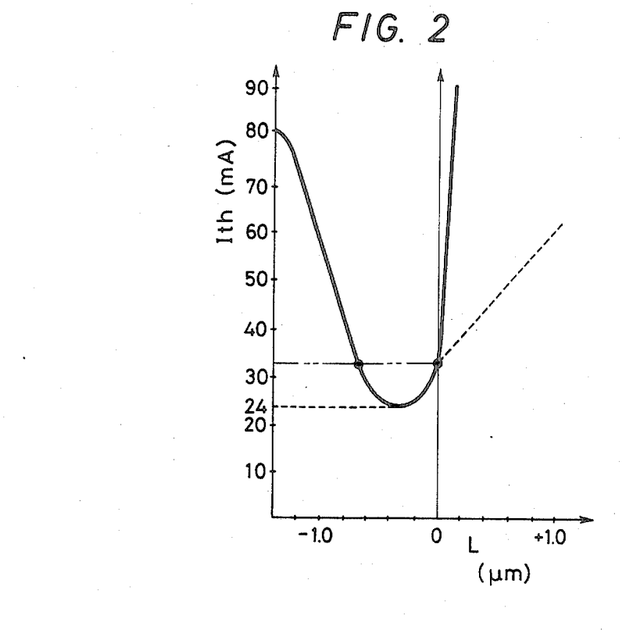
FIG. 2 is a diagram showing the correlation of the threshold current with the change of the position of the active layer in the BH laser chip.
Figure 4:
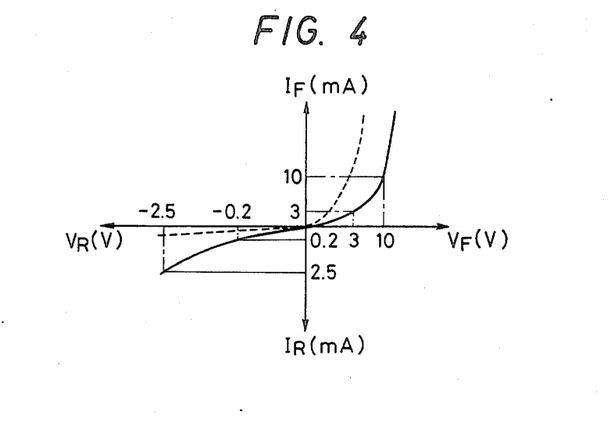
FIG. 4 is a diagram showing the V - I characteristics of the BH laser chip.

The threshold current $I_{th}$ (hereinafter called also "I") exhibits a change such as shown in the diagram of FIG. 2 with the relation between the position of the active layer and that of the neck. When the active layer is positioned on the positive side (or when the center position of the active layer 3 is located on the side of the clad layer 6 (on the upper side) from the neck position), the threshold current $I_{th}$ increases drastically. In the diagram, the threshold current $I_{th}$ increases drastically. In the diagram, the threshold current ($I_{th}$) [unit: mA] at room temperature is plotted on the ordinate and the position (L) of the active layer with respect to the neck (the position of the center portion of the active layer) [unit: μm] is plotted on the abscissa. The dash line represents line based on a theoretical value when the position of the active layer is nothing but a parameter deciding its width. As shown in the diagram, the threshold current value $I_{th}$ decreases practically as the active layer is positioned towards the negative side from the neck (that is, the center position of the active layer 3 is on the side of the buffer layer 2 (on the lower side) from the neck position), and $I_{th}$ attains a minimal value of about 24 mA at the position of −0.3 μm, and becomes thereafter gradually higher. With the position (L) of the active layer being in the range of from −0.6 μm to −0.7 μm, $I_{th}$ at that position becomes substantially equal to $I_{th}$ at L=O, and the $I_{th}$ value is from 32 mA to 33 mA. When the position (L) of the active layer becomes positive, $I_{th}$ increases drastically and can not be used any more. FIG. 4 shows the relation between a voltage applied to a laser diode and a current flowing thereby. In the diagram, the dotted line represents theoretical characteristics, but it has been found that the practical characteristics are not in agreement with the theoretical characteristics described above but exhibit those represented by the solid line.

Figure 3:
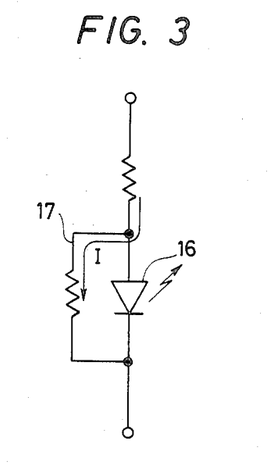
FIG. 3 is an equivalent circuit diagram at the double hetero junction of the BH laser chip.

When the position of the active layer is on the positive side with respect to the neck as shown in FIG. 3, this difference between the theoretical characteristics and the practical characteristics is believed to result from the existence of a leakpass 17 in parallel with the laser diode 16.

The difference of the positive and negative positions of the active layer depends on whether both side surfaces of the active layer are in contact with the inverted mesa plane (A plane) formed by etching the inverted mesa portion or in contact with the forward mesa plane (B plane) formed by etching the forward mesa portion. The forward mesa plane (B plane) close to the neck is the (111) plane on which the phosphorus atoms (P atoms) appear, and the inverted mesa plane (A plane) is the (111) plane on which the In atoms appear. It is therefore believed that on the (111) plane (B plane) on which P atoms appear, bonding of the interface between the side surface of the active layer and this plane is high, while on the (111) plane (A plane) on which the In atoms appear, bonding of the interface is not sufficiently high so that the leak pass occurs.

Two leak passes are believed to occur. The first is a pass through which the surface current flows along the (111) plane (A plane) on which the In atoms appear, from the clad layer 4 to the buffer layer 2. The other is a pass which occurs because the height of the junction barrier of the p-n junction formed by the block layer 8, which is in contact with the (111) plane (A plane) on which the In atoms appear, and the buffer layer 2, is lower than that of the active layer.

The inventors of the present invention have confirmed that lighter atoms other than the In atoms seem to exist on the X-ray photograph of the (111) plane (A plane) on which the In atoms appear. However, it has not been clarified yet whether the lighter atoms are contamination that has been deposited on the interface during etching and has remained unremoved by washing, or foreign matter that has been deposited during epitaxial growth of the blocking layer, buried layer 9 and cap layer 10.

On the basis of the studies described above, the inventors have realized that the threshold current value can be reduced by arranging the position of the active layer below the neck (on the negative side) because both side surfaces of the active layer 3 come into contact with the B plane which is the stable plane.

FIGS. 5 through 10 are sectional views showing each respective production step of the BH laser chip in accordance with one embodiment of the invention. FIG. 11 shows an example when the laser chip is assembled into a box-like package, and is a sectional view of an oscillator for optical communication (light emitting electronic appliance).

First of all, the structure of the laser chip will le described step-by-step with reference to the production steps thereof.

Although this embodiment will deal with a BH laser chip of a long band InP-InGaAsP system by way of example, it is to be understood that the present invention can likewise be applied to a BH laser chip of a GaAs-Ga-AlAs system of a visible band. The ratio of each mixed crystal is not described in particular, because it is well known in the art.

Figure 5:
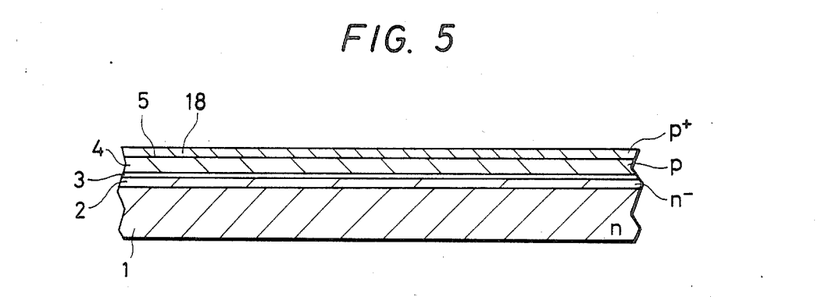
FIG. 5 is a sectional view of a wafer used for producing the BH laser chip in accordance with the present invention.

The laser chip of this embodiment can be produced in the following manner. First, a wafer (semiconductor thin sheet) 18 shown in FIG. 5 is prepared. The wafer 18 consists of 200 $\mu$m (d=200 $\mu$m) single crystal substrate 1 made of n-type InP, having an impurity concentration of $5 \times 10^{18}$ atoms.cm$^{-3}$; and a multi-layered grown layer which is epitaxially grown on the (100) crystal plane of the substrate 1 as its main surface. The multi-layered grown layer consists of a buffer layer 2 (d=1-2 $\mu$m) made of n$^-$-type InP, an active layer 3 made of undoped InGaAsP (d=0.15 $\mu$m), a clad layer 4 made a p-type InP (d=3.5-4 $\mu$m and a cap layer 5 made of p-type InGaAsP (d=0.1-0.2 $\mu$m), from the lower layer to the upper in the order named. The active layer 3 has hetero junctions on its upper anad lower surfaces to form a double hetero junction, and is 0.15 $\mu$m thick.

Figure 12:
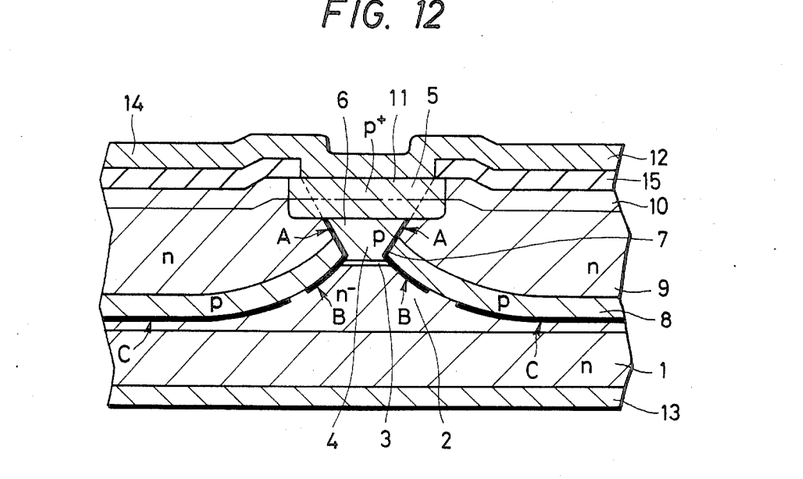
FIG. 12 is a sectional view of the BH laser chip when a blocking layer is not in contact with a substrate in the present invention.

Next, a plurality of etching masks 19 consisting of about 5 to 6 $\mu$m wide belt-like SiO$_2$ films or the like are formed in parallel with one another on the main surface of this wafer 18. The semiconductor layers exposed from the masks 19 are etched by an etching solution such as bromoethanol. Etching is made until the surface layer portion of the substrate 1 is reached, though the invention is not particularly limited to this. For example, it may be terminated at an intermediate depth of the buffer layer 2. In this case, a laser chip such as shown in FIG. 12 can be obtained. The resulting chip is different from the laser chip of the first embodiment only in that the etching thickness of the buffer layer is different, and the buffer layer 2 of the laser chip shown in FIG. 12 is thicker.

Figure 6:
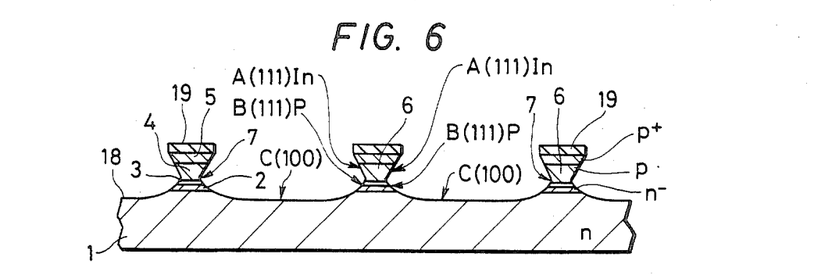
FIG. 6 is a sectional view of the wafer after mesa etching in the production process of the BH laser chip in accordance with the present invention.

Since the masks 19 are disposed so as to extend in the direction of the <110> axis of the crystal, the portions of the double hetero structure remaining below the masks 19 to extend over the cap layer 5 and the clad layer 4 has an inverted mesa cross-section. On the other hand, the buffer layer 2 and the upper layer portion of the substrate 1 have a forward mesa structure which describes a parabola from above to below. The inverted mesa plane becomes the (111) crystal plane (A plane) on which the In atoms appear, and the upper end portion of the forward mesa portion becomes the (111) plane (B plane) on which the P atoms appear. The most contracted portion of the double hetero structure 6, that is, the neck 7, is formed at the boundary between the forward mesa portion and the inverted mesa portion. In this embodiment, the neck width is prescribed to be from 0.9 to 1.5 $\mu$m, for instance. This means that since the inverted mesa plane becomes the (111) plane of the crystal, it can be formed with high reproducibility by setting in advance the size of each layer and the mask width. The active layer 3 which is 0.15 $\mu$m thick is formed so that the position of the surface coming into contact with the buffer layer 2 (that is, the lower surface) is lower (negative) than the position of the neck 7. The position of the active layer 3 is between 0 and 0.6 $\mu$m (at the center position of the active layer) as can be seen from the diagram of FIG. 2, for example. As a result, the laser chip produced by this method has a low threshold current value ($I_{th}$) ranging from about 24 to 30 mA, and the maximum width of thr active layer 3 is up to 2 $\mu$m.

Figure 7:
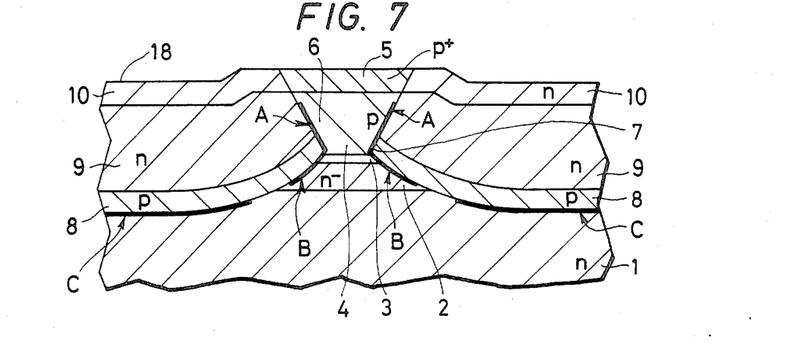
FIG. 7 is a sectional view of the wafer after the burying and growing treatment in accordance with the present invention.

Next, after the masks 19 have been removed from the main surface of the wafer 18, a blocking layer 8 (d=0.5 $\mu$m) of p-type InP, a buried layer 9 (d=3.5-0.5 $\mu$m) of n-type InP and a cap layer 10 (d=0.1-0.2 $\mu$m) of n-type InGaAsP are sequentially formed by liquid phase epitaxial technique in the recessed portion formed by etching, as shown in FIG. 7.

Figure 8:
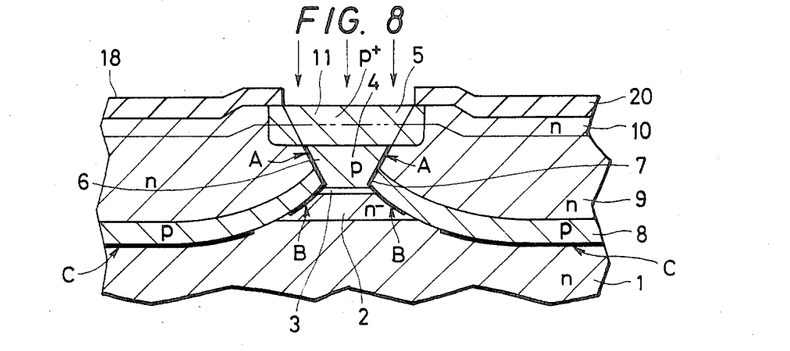
FIG. 8 is a sectional view of the wafer after an ohmic contact layer has been formed in accordance with the present invention.

Then, a mask 20 is formed on the main surface of the wafer 18 so that the upper surface of the mesa portion 6 is exposed, and Zn is thereafter diffused. The mask 20 may consist of an insulating film such as a CVD-PSG film (phosphosilicate glass film formed by chemical vapor deposition) or a two-layered structure of this insulating film and a photoresist film used for patterning this insulating film. This Zn diffusion forms a p$^+$-type ohmic contact layer 11 in the mesa portion which layer 11 reaches the intermediate depth (0.5-0.8 $\mu$m) of the clad layer 4.

Figure 9:
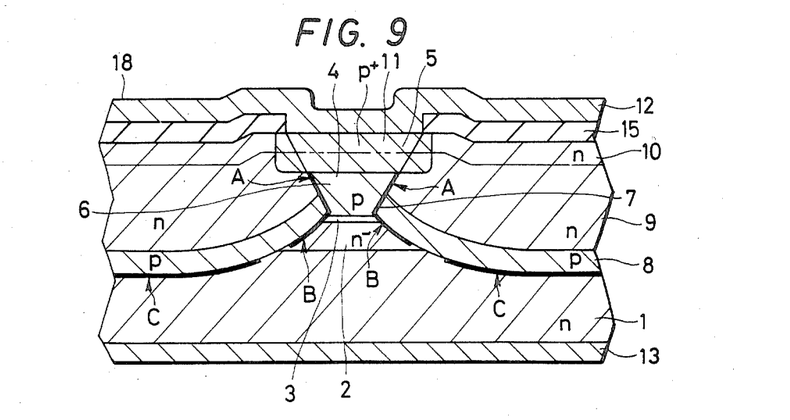
FIG. 9 is a sectional view of the wafer after electrodes have been formed in accordance with the present invention.

Next, the mask 20 is removed as shown in FIG. 9, and an electrode 12 having a lower surface layer consisting of Cr (d=0.7 $\mu$m) and an upper surface layer consisting of Au (d=1 $\mu$m) is formed on the main surface side of the wafer 18. The portion of the substrate 1 of the wafer 18 is etched. After the substrate 1 becomes about 100 μm thick, AuGeNi (d=0.3 μm), Pd (d=0.2 μm) and Au (d=1.2 μm) are sequentially evaporated on the reverse of the wafer 18, forming another electrode 13. However, the state of lamination of these electrodes 12 and 13 is not shown in the drawing.

Figure 10:
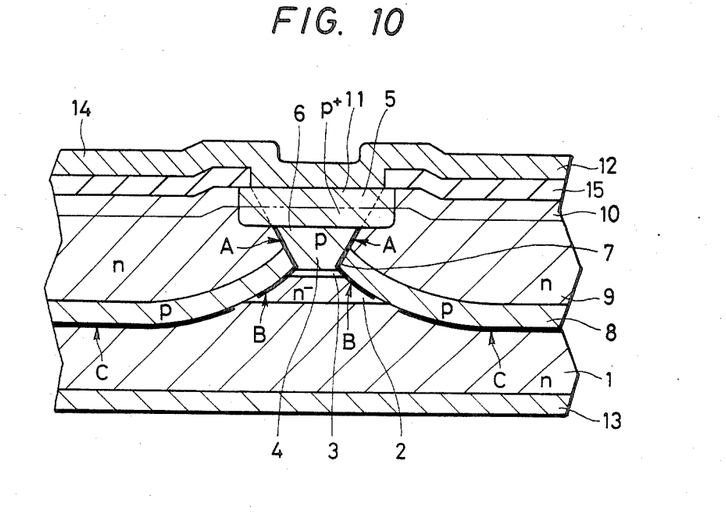
FIG. 10 is a sectional view of the BH laser chip in accordance with the present invention.
Figure 11:
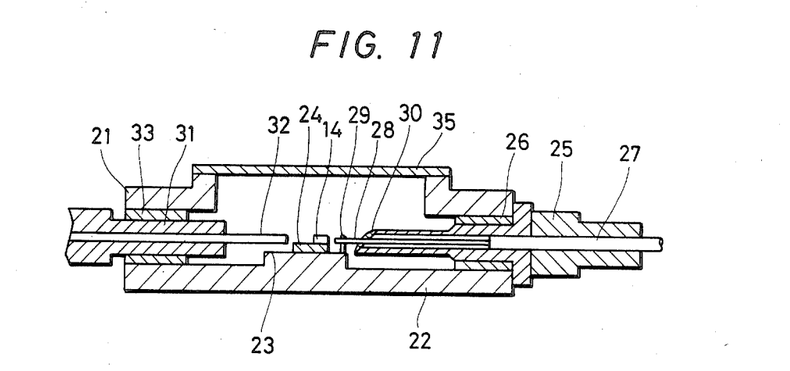
FIG. 11 is a sectional view of an oscillator for optical communication (light emitting electronic appliance) which incorporates therein the BH laser chip in accordance with the present invention.

Next, the wafer 18 is divided in the desired manner, and a large number of BH laser chips 14 such as shown in FIG. 10 can be produced.

Figure 13:
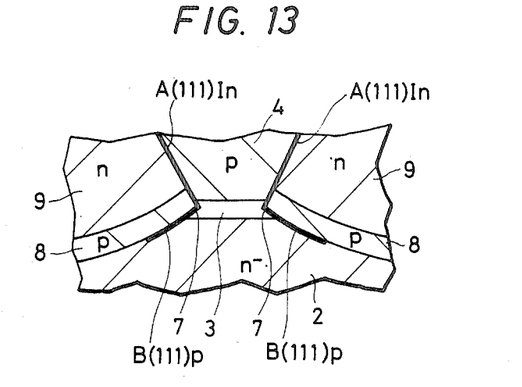
FIG. 13 is an enlarged view of principal portions in another embodiment of the present invention.

The present invention is not particularly limited to the embodiment described above, but may have a structure such as shown in FIG. 13. In other words, since the principal portions of the side surfaces of the active layer are in contact with the B plane [(111) plane] which is the stable plane, it is possible to prevent the passage of the leakage current.

The laser chip 14 produced according to the steps described above has a light emitting wavelength in the 1.3 μm band, and can be incorporated as a light source in an oscillator 21 for optical communication as shown in FIG. 11. In the oscillator, the laser chip 14 is fixed to a bed 23 at the center of the recess of a metallic stem 22 (kovar) via a silicon carbide (SiC) sub-mount 24. A fiber guide 25 made of the kovar is inserted through the peripheral wall of the stem 22 and is hermetically fixed to the stem 22 by silver brazing 26. A fiber cable 27 is inserted into this fiber guide 25. The jacket is peeled off from the inner end portion of the fiber cable 27 to form an optical fiber (diameter=135 μm) consisting of a core (diameter=10 μm) and a clad (diameter=125 μm) in such an arrangement as to oppose the light emitting surface of the laser chip 14 and to efficiently take the laser light into the optical fiber 28. The tip of the optical fiber 28 is held in place by a fixing member 29 so that its position relative to the light emitting surface of the laser chip 14 does not change. The optical fiber 28 and the fiber guide 25 are hermetically sealed by silver brazing to prevent moisture from entering the stem 22 through the optical fiber.

A monitor fiber guide 31 made of kovar is fixed to the other side wall of the stem 22, and a monitor optical fiber 32 at its inner end (having a diameter of 1 mm) faces the other laser light emitting surface of the laser chip 14. The monitor fiber guide 31 is fixed to the stem 22 by silver brazing 33 so as to keep the interior of the stem 22 air-tight. The monitor fiber guide 31 and the monitor optical fiber 32 are hermetically fixed by low melting glass (not shown). The recess of the stem 22 is also maintained air-tight by a metallic cap 35.

When a voltage is applied across the oscillator described above and a lead not shown in the drawing, the laser chip 14 emits laser light. The laser light is transferred to a desired position through the optical fiber 28 as the transmission medium. The optical output of the laser light is constantly monitored by the monitor optical fiber 32 so that the optical output becomes constant.

The embodiment of the invention described above provides the following effects.

(1) In the BH laser chip obtained in accordance with the present invention, the position of the active layer is on the negative side from the neck position of the mesa-like double hetero structure portion, and the side surface of the active layer are out of contact with the (111) plane having an interface which is believed to be incomplete and on which the In atoms appear. In addition, the width of the active layer is as small as from 1.6 to 2 μm. For these reasons, the threshold current value ($I_{th}$) becomes as small as from 24 to 30 mA.

(2) Due to the effect described in item (1), transverse mode oscillation becomes stable, the occurrence of a kink in the current-optical output characteristics can be prevented, and the movement of the near field image and the deflection of the remote field image can be prevented.

(3) Since the position of the active layer is below the neck in the laser chip of the present invention, it can be easily identified so that it serves as a guide when discriminating the chips and carrying out intermediate inspection, thus making them easier to produce.

(4) Since $I_{th}$ becomes smaller in the laser chip of the present invention, the driving current becomes lower and the exothermy of the chip can be restricted to a low level. Therefore, the temperature characteristics, the optical output and screening yield can be improved.

(5) Since the temperature characteristics can be improved as described in item (4), the service life of the chips can be extended.

(6) The cost of production of the laser chips having excellent characteristics can be reduced due to the effects described in items (1) through (5) described above.

(7) The optical communication apparatus incorporating therein the laser chip of the present invention has a low threshold current value and a small driving current. Therefore, the occurrence of the kink, the movement of a near field image and the deflection of a remote field image can be prevented so that high optical coupling efficiency can be kept at low power and with less noise, and optical communication can be effected with a high level of reliability and stability.

It is to be understood that the above-described arrangements are simply illustrative of the application of the principles of this invention. Numerous other arrangements may be readily devised by those skilled in the art which embody the principles of the invention and fall within its spirit and scope.

We claim:
1. In a light emitting chip comprising:
(1) a semiconductor substrate of a first conductivity type;
(2) a first semiconductor layer of a the first conductivity type coming into contact with a part of said semiconductor substrate of the first conductivity type;
(3) an active layer coming into contact with said first semiconductor layer of the first conductivity type and having side surfaces;
(4) a second semiconductor layer of a second conductivity type coming into contact with said active layer;
(5) a third semiconductor layer of the second conductivity type, coming into contact with a part of said semiconductor substrate of the first conductivity type, wherein said third semiconductor layer has an opening which includes a neck portion defining a point of intersection between an end surface of said third semiconductor layer at said opening and a bottom surface of said third semiconductor layer at said opening, and wherein said third semiconductor layer interposes a part of each of said first semiconductor layer of the first conductivity type, said active layer and said second semiconductor layer of the second conductivity type at said opening; and

(6) a fourth semiconductor layer of the first conductivity type coming into contact with said third semiconductor layer of the second conductivity type, wherein said fourth semiconductor layer includes an opening and interposes a portion of said second semiconductor layer of the second conductivity type at said opening, wherein said side surfaces of said active layer are positioned below said neck portion to contact said bottom surface of said third semiconductor layer at said opening of said third semiconductor layer.

2. The light emitting chip according to claim 1, wherein said semiconductor substrate of the first conductivity type, said first semiconductor layer of the first conductivity type, said second semiconductor layer of the second conductivity type, said third semiconductor layer of the second conductivity type and said fourth semiconductor layer of the first conductivity type are comprised of an InP compound semiconductor, and wherein said active layer is comprised of an InGaAsP compound semiconductor.

3. The light emitting chip according to claim 1, wherein said active layer is from 0.1 μm to 0.2 μm thick and from 1.6 μm to 2 μm wide.

4. In a light emitting chip comprising:
(1) a semiconductor substrate of a first conductivity type;
(2) a first semiconductor layer of a the first conductivity type coming into contact with a part of said semiconductor substrate of the first conductivity type;
(3) an active layer coming into contact with said first semiconductor layer of the first conductivity type and having side surfaces;
(4) a second semiconductor layer of a second conductivity type coming into contact with said active layer;
(5) a third semiconductor layer of the second conductivity type, coming into contact with said first semiconductor layer of the first conductivity type, wherein said third semiconductor layer has an opening which includes a neck portion defining a point of intersection between an end surface of said third semiconductor layer at said opening and a bottom surface of said third semiconductor layer at said opening, and wherein said third semiconductor layer interposes a part of each of said active layer and said second aemiconductor layer of the second conductivity type at said opening; and
(6) a fourth semiconductor layer of the first conductivity type, coming into contact with said third semiconductor layer of the second conductivity type, wherein said fourth semiconductor layer includes an opening and interposes a portion of said second semiconductor layer of the second conductivity type at said opening, wherein said side surfaces of said active layer are positioned below said neck portion to contact said bottom surface of said third semiconductor layer at said opening of said third semiconductor layer.

5. The light emitting chip according to claim 4, wherein said semiconductor substrate of the first conductivity type, said first semiconductor layer of the first conductivity type, said second semiconductor layer of the second conductivity type, said third semiconductor layer of the second conductivity type and said fourth semiconductor layer of the first conductivity type are comprised of an InP compound semiconductor, and wherein said active layer is comprised of an InGaAsP compound semiconductor.

6. The light emitting chip according to claim 4, wherein said active layer is from 0.1 μm to 0.2 μm thick and from 1.6 μm to 2.0 μm wide.

7. A semiconductor laser device with a buried double heterostructure comprising:
(a) a semiconductor substrate of a first conductivity type;
(b) a double heterostructure formed on said substrate, including a buffer layer of the first conductivity type, an active layer, and a clad layer of a second conductivity type, said double heterostructure having a mesa portion, an inverted mesa portion and a neck portion defining a point of intersection between said mesa portion and said inverted mesa portion, side surfaces of said active layer being positioned below said neck portion at said mesa portion;
(c) a blocking layer of the second conductivity type formed on said mesa portion; and
(d) a buried layer of the first conductivity type formed on said blocking layer except for the top surface of said double heterostructure.

8. The semiconductor laser device with a buried double heterostructure according to claim 7, wherein said double heterostructure is comprised of In atoms and phosphorus atoms.

9. The semiconductor laser device with a buried double heterostructure according to claim 8, wherein the side surfaces of said active layer has a (111) crystal plane on which phosphorus atoms appears.

* * * * *